United States Patent
Grant et al.

(10) Patent No.: US 6,391,804 B1
(45) Date of Patent: May 21, 2002

(54) METHOD AND APPARATUS FOR UNIFORM DIRECT RADIANT HEATING IN A RAPID THERMAL PROCESSING REACTOR

(75) Inventors: Robert W. Grant, Camden, MA (US); Benjamin J. Petrone, Mt. Bethal; Ronald F. Klopp, Sinking Spring, both of PA (US); Theodore E. Farley, Pine Bush, NY (US); Paul D. Mumbauer, Coopersburg, PA (US)

(73) Assignee: Primaxx, Inc., Allentown, PA (US)

( * ) Notice: Subject to any disclaimer, the term of this patent is extended or adjusted under 35 U.S.C. 154(b) by 0 days.

(21) Appl. No.: 09/590,824

(22) Filed: Jun. 9, 2000

(51) Int. Cl.[7] .............................................. H01L 21/324
(52) U.S. Cl. ......................... 438/795; 438/308; 438/795
(58) Field of Search ................................. 438/308, 795, 438/799

(56) References Cited

U.S. PATENT DOCUMENTS

| 5,203,958 A | * | 4/1993 | Arai et al. ..................... 216/67 |
| 5,503,881 A | * | 4/1996 | Cain et al. .................... 438/716 |
| 5,504,831 A | * | 4/1996 | Sandhu et al. ............... 392/418 |
| 5,654,904 A | * | 8/1997 | Thakur ......................... 702/137 |
| 5,762,713 A | * | 6/1998 | Paranjpe ....................... 118/725 |

OTHER PUBLICATIONS

Knutson et al.; Modeling of Three–Dimensional Effects on Temperature Uniformity in Rapid Thermal Processing of Eight Inch Wafers, IEEE Transactions on Semiconducting Manufacturing vol. 7, No. 1, Feb. 1994, pp. 68–71.*

* cited by examiner

Primary Examiner—John F. Niebling
Assistant Examiner—Christopher Lattin
(74) Attorney, Agent, or Firm—Hugh D. Jaeger

(57) ABSTRACT

Method and apparatus for uniform direct radiant heating in a rapid thermal processing reactor where uniformity of temperature across the width and breadth of a semiconductor wafer is achieved by placement of a dome-shaped thermal insert in close proximity to a semiconductor wafer in process. Thermal energy is absorbed by the thermal insert from the semiconductor wafer at a high rate where the spacing between the thermal insert and semiconductor wafer is at a minimum and at a gradually reduced rate where the spacing between the thermal insert and semiconductor wafer is gradually increased. A guard ring is also incorporated to negate bottom side reflective thermal energy exposure.

11 Claims, 4 Drawing Sheets

METHOD AND APPARATUS FOR UNIFORM DIRECT RADIANT HEATING IN A RAPID THERMAL PROCESSING REACTOR

CROSS REFERENCES TO CO-PENDING APPLICATIONS

None.

BACKGROUND OF THE INVENTION

1. Field of the Invention

This invention relates generally to the rapid thermal processing of objects heated by electromagnetic radiation within the visible, infrared and other near-visible wavelength ranges and, more specifically, to the efficient, controlled and uniform heating of an object in a rapid thermal processing reactor by uniform radiant heating of the object by a radiation source, whereby heat in the center of the object is influenced by a heat absorbing thermal insert located in close proximity to the underside of the object.

2. Description of the Prior Art

In the case of Ferroelectric material processing, rapid uniform heating is crucial in achieving useful remanent polarization characteristics. As for processing of dielectric materials, uniform heating is also critical in achieving low, medium and high dielectric constants for these materials. Equipment is needed to accomplish the required heat treating steps in a very rapid and efficient manner so that the total time at high temperature is minimized, so that throughput is maximized, and so that heating of the substrate is accomplished in a uniform manner. As the lateral feature sizes of microelectronic devices continue to shrink, scaling laws require that vertical dimensions be reduced correspondingly. In particular, vertical dimensions or junctions defined by impurity diffusions must be made more and more shallow. However, these shallow dimensions or junctions will diffuse to greater depths in the device substrate during the various heat treating steps required in the device fabrication.

To meet this requirement, so called Rapid Thermal Processing (RTP) tools (reactors) have been developed and widely used in the fabrication of silicon-based and gallium arsenide-based integrated circuits and in the production of large flat panel displays. To achieve the fast thermal response desired, RTP tools or reactors commonly process one substrate at a time. In silicon processing, the substrate is a silicon wafer and, for convenience, typical substrates may be referred to as "wafers." This is not to limit the scope of this invention to only the processing of silicon devices; indeed, the invention includes, but is not limited to, the processing of gallium arsenide devices, circuits built on silicon-on-insulator (SOI) substrates, flat panel displays, magnetic storage media, and magnetic disk head devices. An additional advantage of single wafer processing tools is that production facilities using such tools can be optimally configured for maximum throughput and minimum cycle time.

Currently, RTP tools heat wafers by direct thermal radiation. That is, a high temperature heat source, such as tungsten-halogen lamps or argon arc lamps, heats the wafer by direct radiation. Unfortunately, there are several disadvantages associated with such direct radiation.

When heated in a reflective enclosed volume, such as an enclosed process chamber, the wafer exhibits spatial temperature nonuniformities. Such nonuniformities vary through the different temperature ramping and steady state steps of the RTP cycle and are dependent upon the relative temperatures of the lamps, the wafer and the walls of the enclosed process chamber. Segmenting the heat source into spatial zones and controlling such zones based on local temperature measurements has been only marginally successful in controlling these nonuniformities. Moreover, such temperature zone control requires complex and expensive hardware and software.

More commonly, a guard ring is provided to surround the wafer. The guard ring allows most of the temperature nonuniformities to occur within the guard ring rather than within the wafer. Although this approach is more economical, it is only a limited solution.

SUMMARY OF THE INVENTION

The instant invention is directed to a method and apparatus for uniformly heating an object in an enclosed volume. This invention provides for the enclosed volume or process chamber, an object such as a semiconductor wafer disposed within the enclosed volume, a heat source such as, but not limited to, tungsten-halogen lamps, the heat of which is directed to the enclosed volume through a transparent window, a guard ring, and a configured thermal insert of stainless steel or aluminum metal or some other chamber compatible material underlying the semiconductor wafer or other object. Preferably, the object is a semiconductor wafer processed in the enclosed process chamber of the rapid thermal processing reactor. The transparent window allows radiant energy to transmit to the semiconductor wafer. The semiconductor wafer, if not for the presence of a geometrically configured thermal insert, would receive and absorb thermal energy through its upper surface to be distributed vertically through the structure of the semiconductor wafer, that thermal energy being distributed (e.g., at steady state) and being of higher concentration at the central regions (laterally) of the semiconductor wafer than that thermal energy found at the outer regions (laterally) near or adjacent the edges of the semiconductor wafer. This is due to the larger radiating surface area at the edges making them cooler (at steady state). Introduction of the geometrically configured thermal insert, generally referred to as the thermal insert, influences the temperature of the semiconductor wafer by heat absorption. The thermal insert exhibits a low profile dome-like structure, having a specific spherical radius or diameter or other suitable geometric design or shape, which absorbs or draws off heat, at appropriate and different rates, from the semiconductor wafer to provide uniform temperature across the breadth of the semiconductor wafer during and after the heating process. The thermal insert is located in close proximity to the undersurface of the semiconductor wafer such that the vertical distance from the thermal insert and the semiconductor wafer gradually increases when measured outwardly in increasing increments from the centers of the thermal insert and the semiconductor wafer. Heat is extracted, absorbed or transferred away from the center of the semiconductor wafer by the underlying thermal insert at a rate higher at the center than at or near the edges to compensate for the characteristic temperature rise. The rate of absorption decreases from the center region toward the outer region depending upon the spherical radius or other geometrically configured upper surface of the thermal insert.

In one embodiment, the transparent window material and the enclosed process chamber is hexagonal, circular or of other suitable shape, and the thermal insert is positioned extremely close to the semiconductor wafer and to a concentric guard ring which minimizes lamp radiation from reflecting off the surfaces of the wager and the enclosed process chamber and reaching the backside of the wafer where non-contact temperature measurement of the wafer would have been made. In this preferred embodiment, temperature measurement errors induced by lamp radiation are minimized by the concentrically located guard ring.

According to one embodiment of the present invention, there is provided an apparatus for direct radiant heating in a rapid thermal processing reactor, the major components of which include a reactor body, an enclosed process chamber central to the reactor body, an inlet manifold and an outlet manifold opposingly located and attached to the reactor body for porting to the enclosed process chamber, an access port, quartz or ceramic, wafer or guard ring, support pins, a pyrometer, a thermal insert residing in the enclosed process chamber and aligned over the wafer support pins and/or a thermocouple support pin to the bottom of the reactor body, a guard ring concentrically aligned with the thermal insert as well as with the pyrometer, a transparent window aligned and secured to the upper region or top of the reactor body, a window cooling ring, a lamp box enclosure including a top where the lamp box enclosure secures to the upper region or top of the reactor body, tungsten-halogen lamps or other heat sources, and a plurality of water cooling tubes in and about the reactor body, the lamp box enclosure and lamp box enclosure top, and the window cooling ring.

One significant aspect and feature of the present invention is the use of a heat absorbing insert for transferring of heat from the center region of a semiconductor wafer to provide uniform heating along and about the breadth of a semiconductor wafer.

Another significant aspect and feature of the present invention is a heat absorbing thermal insert exhibiting a dome-shaped top surface.

Yet another significant aspect and feature of the present invention is a thermal insert which locates in close proximity to the underside of a semiconductor wafer for heat absorption therefrom.

A further significant aspect and feature of the present invention is the use of a guard ring to minimize radiant energy from reaching the backside of the wafer, and hence, the pyrometer apparatus.

Having thus described embodiments and significant aspects and features of the present invention, it is the principal object of the present invention to provide a method and apparatus for uniform direct radiant heating in a rapid thermal processing reactor.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENT

Figure 1:
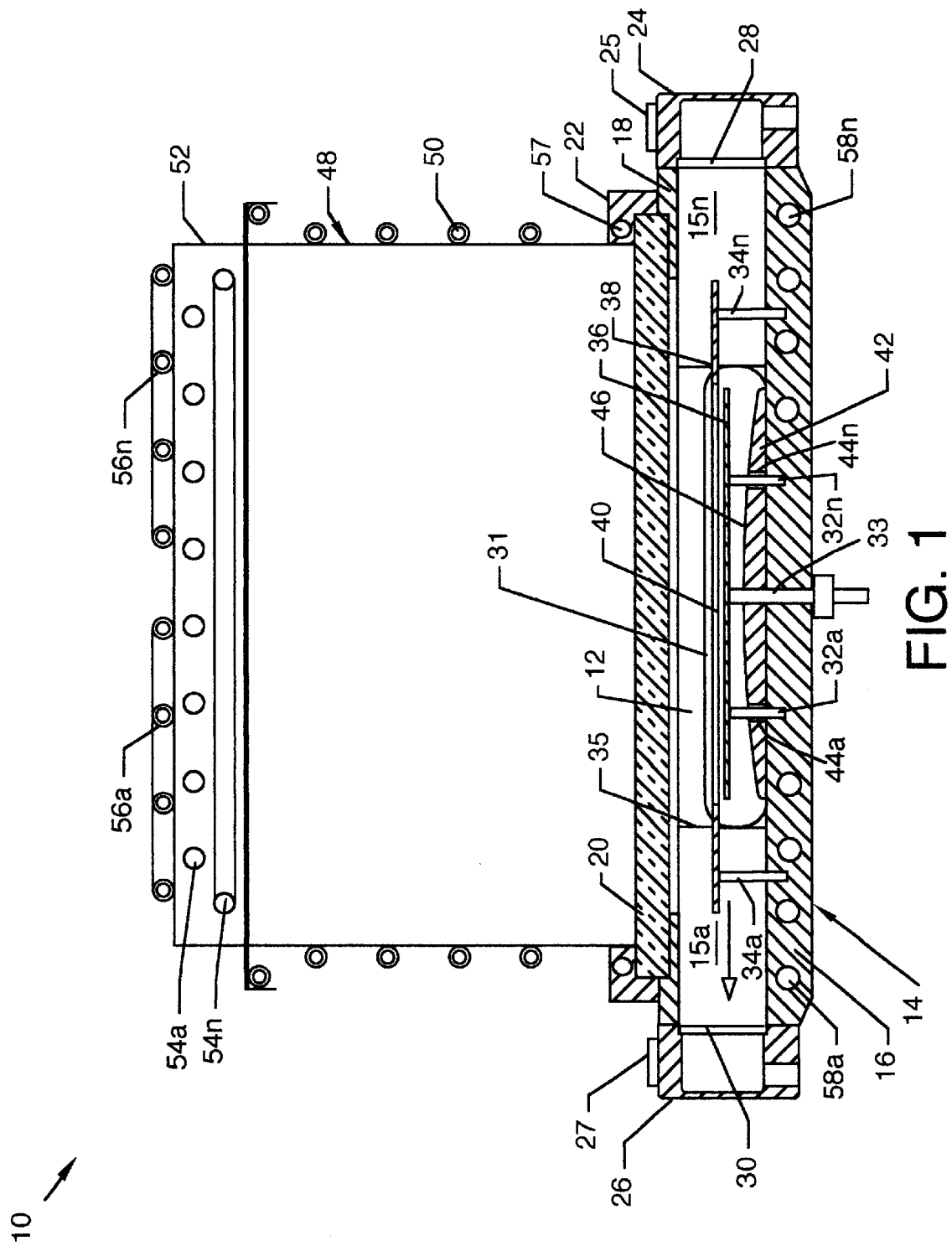
FIG. 1 illustrates a side view of a rapid thermal processing reactor which includes apparatus for direct radiant heating, the present invention, with a portion thereof shown in cross section as taken along line 1—1 of FIG. 2.

FIG. 1 illustrates a side view, partly in cross section view along line 1—1 of FIG. 2, of a rapid thermal processing reactor 10 which includes apparatus for direct radiant of a semiconductor wafer or other such object in an enclosed volume, herein called an enclosed process chamber 12, described later in detail. The rapid thermal processing reactor 10 is used to uniformly heat an object, preferably a semiconductor wafer 36 or other substantially planar object, in the enclosed process chamber 12. The rapid thermal processing reactor 10 includes a centrally located reactor body 14 to which various components are attached or secured. An enclosed process chamber 12 is located between and formed by a reactor body bottom plate 16, a continuous reactor body top flange 18, a transparent window 20, reactor body walls 15a–15n, an inlet manifold 24 and an outlet manifold 26, and the transparent window 20 (preferably made of quartz secured to the top flange 18 by a window cooling ring 22). The inlet manifold 24 includes an inlet diffuser 28 to distribute incoming process gases uniformly across a wafer surface, and the outlet manifold 26 includes an outlet diffuser 30 in the form of a distribution plate with graduated orifices to maintain a uniform gas flow across a wafer surface. One or more temperature controlled silicone heating pads 25 and 27 are attached to the outer surfaces of the inlet and outlet manifolds 24 and 26, respectively, and provide heat to preclude vapor condensation in the manifolds. A sliding gate valve 31 (see also FIG. 2) and a port 35 (see also FIG. 2) located at the reactor body 14 offer access to the enclosed process chamber 12 for robotic placement and retrieval of the semiconductor wafer 36. A plurality of quartz or alumina wafer support pins 32a–32n, which can be vertically adjustable, and a plurality of quartz or alumina guard ring support pins 34a–34n, which can be vertically adjustable, extend upwardly and vertically from the bottom plate 16 into the enclosed process chamber 12, as also illustrated in FIG. 3. The wafer support pins 32a–32n support a semiconductor wafer 36, which is being processed, in the enclosed process chamber 12 during processing. A thermocouple wafer support pin can be used in place of one of the wafer support pins 32a–32n to support wafer 36 and to provide temperature monitoring. The guard ring support pins 34a–34n support a guard ring 38. A pyrometer 33 or thermocouple wafer support pins 32a–32n measures the temperature of semiconductor wafer 36 and sends temperature data sensed at the semiconductor wafer 36 to an externally located control to regulate the heat provided by the heat sources 54a–54n. The guard ring 38 includes a large circular aperture 40 which allows heat energy radiated through the transparent window 20 to impinge the semiconductor wafer 36. A thermal insert 42 aligns concentrically with the guard ring 38 and is supported by the reactor body bottom plate 16. The location of the thermal insert 42 is fixed by utilizing the quartz wafer support pins 32a–32n which align through vertically aligned locator holes 44a–44n, as also illustrated in FIG. 3. The thermal insert 42, constructed of aluminum, stainless steel or other suitable material, is generally provided having a convex dome-shaped top surface 46 appropriately radiused or otherwise shaped to conduct or transfer re-radiant heat energy from the underside of the overlying semiconductor wafer 36.

In the embodiment, the walls 15a–15n and the bottom 16 of enclosed process chamber 12 are cool and reflective. A lamp box enclosure 48 mates to and extends upwardly from the window cooling ring 22 that includes a surrounding cooling water tube 50 for cooling of the lamp box enclosure 48. A lamp box top 52 aligns to the top of the lamp box enclosure 48 and includes multiple heat sources 54a–54n preferably in the form of a high temperature lamp assembly such as tungsten-halogen or argon arc lamps located longitudinally and transversely along and about the lamp box top 52. A plurality of cooling water tubes 56a–56n are located on the top of the lamp box top 52. A cooling water channel 57 is also located in the window cooling ring 22. The transparent window 20 is preferably transparent quartz or sapphire, quartz being preferred.

As shown in FIG. 1, the invention provides for the transparent window 20 to be located between the semiconductor wafer 36 and the heat sources 54a–54n. When heated by the heat sources 54a–54n, semiconductor wafer 36 rapidly heats to the desired temperature. The heat sources 54a–54n provide a uniform flux of radiant energy which is coupled into the enclosed process chamber 12 through the transparent quartz or sapphire window 20. In this embodiment, the enclosed process chamber 12 is constructed of polished, reflective metal walls 15a–15n which are kept cool by means of internal cooling water channels 58a–58n in the reactor body bottom plate 16. The heat sources 54a–54n, along with the cold reflective enclosed process chamber 12, is commonly referred to as a "photon box." This embodiment provides enhanced uniformity of the radiation heating the semiconductor wafer 36 for the reasons described below.

The semiconductor wafer 36 is interposed between the transparent window 20 and the thermal insert 42 for heating by the radiation sources 54a–54n through the transparent window 20. Preferably, the semiconductor wafer 36 is placed in close proximity to the thermal insert 42.

In the absence of the thermal insert 42 and ring guard 38, when a semiconductor wafer 36 is positioned within the enclosed process chamber 12, spatial temperature nonuniformities would appear due to the fact that the edge of the semiconductor wafer 36 receives and radiates radiant energy from the heat sources 54a–54n through a coupling and absorption factor which is different from that experienced by the center of the semiconductor wafer 36. This is due to the semiconductor wafer 36 receiving and absorbing direct radiant energy and radiant energy which would be reflected from the walls 15a–15n of the enclosed process chamber 12 and reflectively by the reactor body bottom plate 16, the heat of which would be absorbed by the lower surface of the semiconductor wafer 36.

Inclusion of the guard ring 38 interferes with and precludes reflective heat radiation of the bottom side of the semiconductor wafer 36 from the reactor body bottom plate 16 to enhance a temperature constant across and about the breadth and width of the semiconductor wafer 36. Moreover, the thermal insert 42 greatly enhances the temperature constant across and about the breadth and width of the semiconductor wafer 36. Heat transmitted through the transparent window 20 is absorbed by the semiconductor wafer 36 and is concentrated toward the center thereof. The thermal insert 42, being in close proximity to the central bottom surface of the semiconductor wafer 36, absorbs, draws or otherwise transfers heat away from the central bottom surface of the semiconductor wafer 36. The rate at which the heat is absorbed is dependent on the spacing between the bottom surface of the semiconductor wafer 36 and a corresponding point on the dome-shaped top surface 46 of the thermal insert 42 where close spacing absorbs more heat, as near the center of the semiconductor wafer 36, than at the edge of the semiconductor wafer 36 in which a wide spacing exists. The radius or other configured shape of the dome-shaped top surface 46 of the thermal insert 42 is predetermined and constructed to draw or absorb heat in a fashion which yields a constant temperature along and about the width and breadth of the semiconductor wafer 36.

Figure 2:
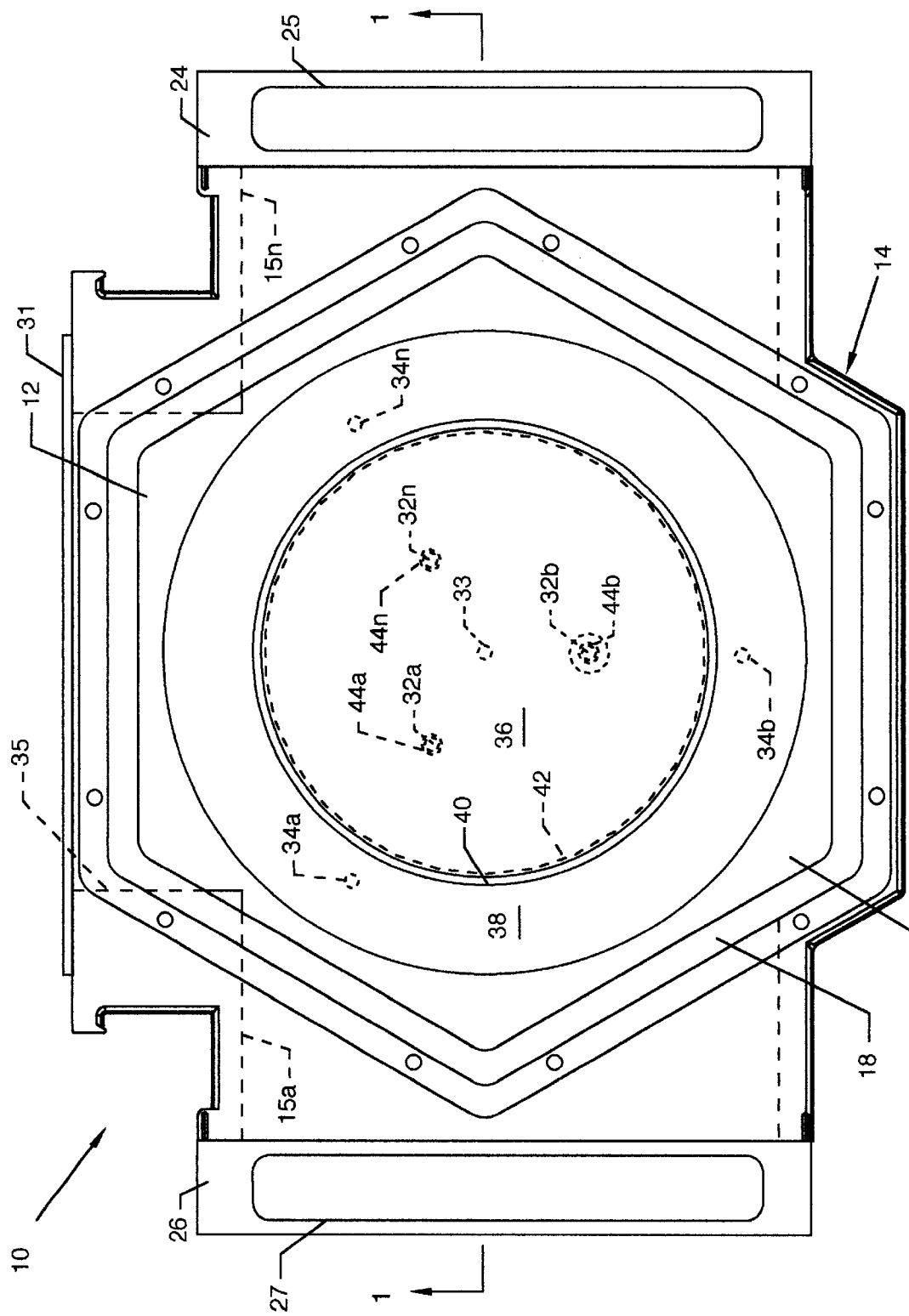
FIG. 2 illustrates a top view of the rapid thermal processing reactor which includes apparatus for direct radiant heating with the transparent window, the window cooling ring, the lamp box enclosure, the heat sources, and the cooling water tubes omitted to reveal internal details.
Figure 3:
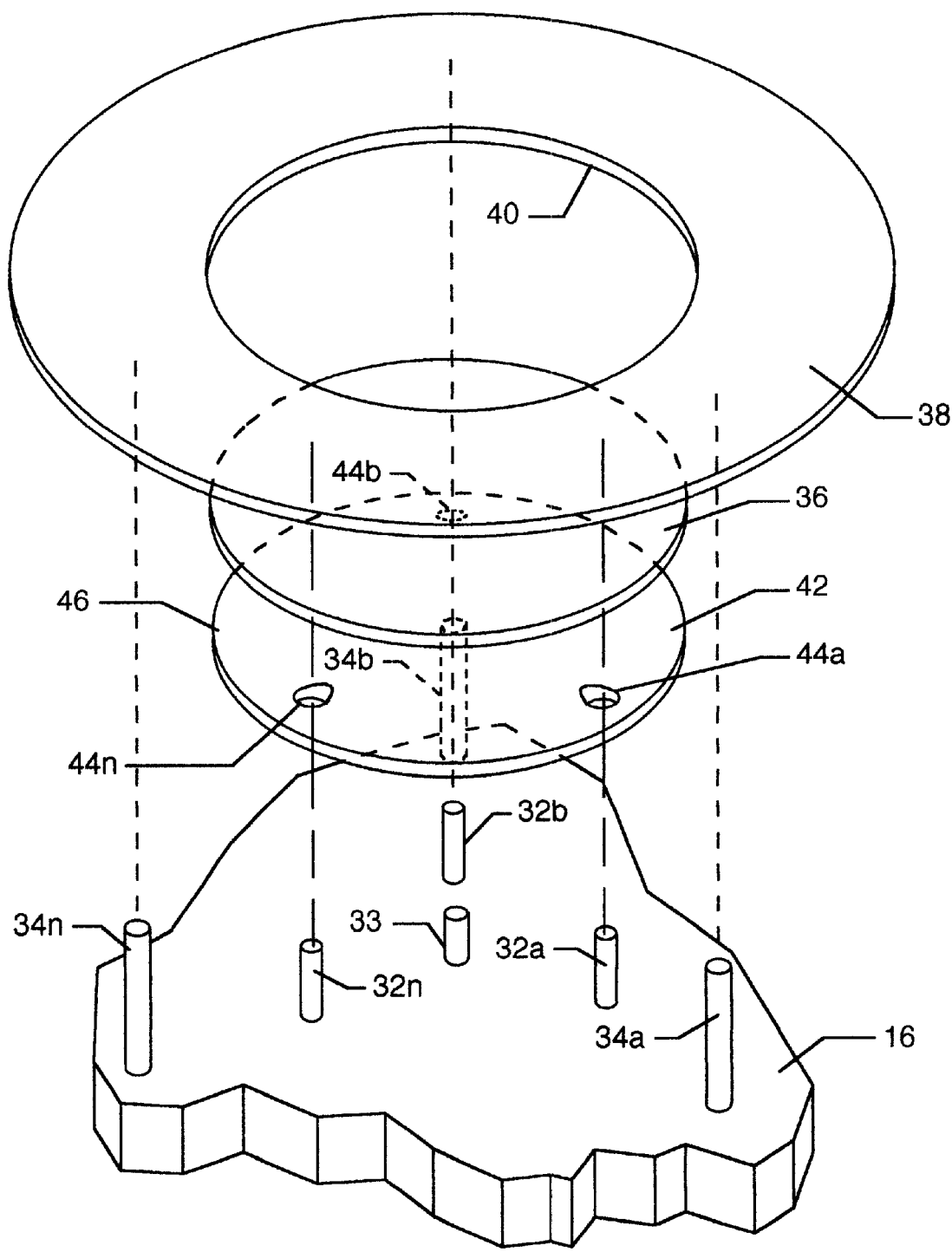
FIG. 3 illustrates an exploded isometric view of the thermal insert, a semiconductor wafer, the guard ring, and the quartz or alumina, support pins used for support and alignment of the thermal insert, the semiconductor wafer, and the guard ring; and, FIG. 4 illustrates the average center edge temperature of semiconductor wafer versus radius of curved thermal insert.

FIG. 2 illustrates a top view of the rapid thermal processing system 10 with the transparent window 20, the window cooling ring 22, the lamp box enclosure 48, the cooling water tubes 56a–56n, and the heat sources 54a–54n removed to reveal the relationship of the thermal insert 42, a semiconductor wafer 36, and the guard ring 38 to the enclosed process chamber 12 which, of course, now is open. All numerals correspond to those elements previously described.

FIG. 3 illustrates an exploded isometric view of the thermal insert 42, a semiconductor wafer 36, and the guard ring 38, in relation to the quartz wafer support pins 32a–32n, the pyrometer 33 and the quartz guard ring support pins 34a–34n, where all numerals correspond to those elements previously described.

Figure 4:
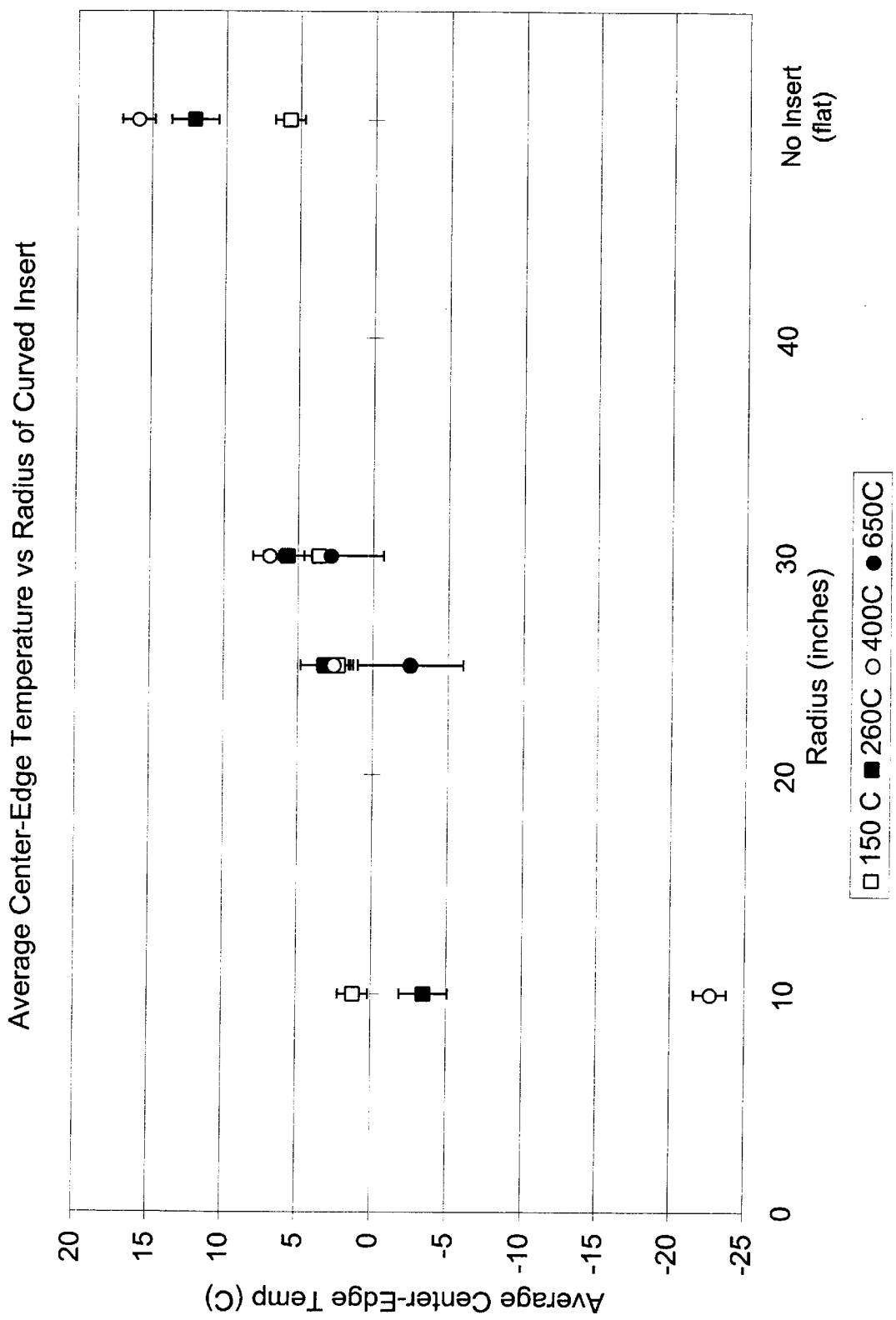

FIG. 4 illustrates the average center edge temperature of semiconductor wafer 36 versus the convex radius of thermal insert 42. With no thermal insert 42, a flat chamber bottom, the semiconductor wafer 36 experiences excessive central radiant energy causing a largely positive average center edge temperature. With decreased radius of curvature for thermal insert 42, the semiconductor wafer 36 experiences increased central cooling, such that the average center edge temperature decreases as the center cools and/or the edges of semiconductor wafer 36 absorb more radiant energy and heat.

MODE OF OPERATION

A semiconductor wafer 36 is inserted into the enclosed process chamber 12 through the sliding gate valve 31 and port 35 by robotic transfer and rests on the wafer support pins 32a–32n. The sliding gate valve 31 is closed and oxygen, ozone, or another gas is injected into the enclosed process chamber 12 as required by the recipe. The reactor outlet manifold 26 is continuously connected to the process exhaust, causing the outlet manifold 26 to be slightly below atmospheric pressure. Gases injected by the inlet manifold 24 and vapors produced by the curing semiconductor wafer 36 are drawn toward the lower pressure outlet manifold 26.

Infrared radiation from the heating sources 54a–54n in lamp box top 52 enters the enclosed process chamber 12 through the transparent window 20 in the top of the reactor 10, heating the silicon semiconductor wafer 36 by radiant heat transfer. The non-contact pyrometer 33 or thermocouple support pin in contact with the bottom of the semiconductor wafer 36 send temperature data to an externally located temperature controller. Output data from the temperature controller regulates the power of the heat sources 54a–54n to control the temperature of the semiconductor wafer 36.

Thermal energy transmitted by the heat sources 54a–54n is directed and passes through the transparent window 20 with minimum attenuation to heat the semiconductor wafer 36 supported in the enclosed process chamber 12. The thermal insert 42 located directly below the semiconductor wafer 36 improves the wafer average center-to-edge temperature uniformity by controlling semiconductor wafer-tothermal insert 42 heat transfer rate. The dome-shaped thermal insert 42 increases heat transfer from the center of the semiconductor wafer 36 to compensate for the characteristic center temperature rise. Temperature can be in a range of 100° C. to 1000° C.

Cooling water passages in the reactor body bottom plate 16 adjacent to the enclosed process chamber 12 and in the window cooling ring 22 allow the circulation of cooling water to help keep the enclosed process chamber 12 wall temperature uniform, reducing interference from reflected radiation. A vacuum exhaust connection in the reactor outlet manifold 26 removes spent process gases and solvent vapors.

Various modifications can be made to the present invention without departing from the apparent scope hereof.

METHOD AND APPARATUS FOR UNIFORM DIRECT RADIANT HEATING IN A RAPID THERMAL PROCESSING REACTOR

PARTS LIST

| | |
|---|---|
| 10 | rapid thermal processing reactor |
| 12 | enclosed process chamber |
| 14 | reactor body |
| 15a–n | reactor body walls |
| 16 | reactor body bottom plate |
| 18 | top flange |
| 20 | transparent window |
| 22 | window cooling ring |
| 24 | inlet manifold |
| 25 | silicone heating pad |
| 26 | outlet manifold |
| 27 | silicone heating pad |
| 28 | inlet diffuser |
| 30 | outlet diffuser |
| 31 | sliding gate valve |
| 32a–n | quartz wafer support pins |
| 33 | pyrometer |
| 34a–n | quartz guard ring support pins |
| 35 | port |
| 36 | semiconductor wafer |
| 38 | guard ring |
| 40 | aperture |
| 42 | thermal insert |
| 44a–n | locator holes |
| 46 | dome-shaped surface |
| 48 | lamp box enclosure |
| 50 | cooling water tube |
| 52 | lamp box top |
| 54a–n | heat sources |
| 56a–n | cooling water tubes |
| 57 | cooling water channel |
| 58a–n | cooling water channels |

What is claimed is:

1. A method to improve center-to-edge temperature uniformity of a wafer being heated in a rapid thermal processing reactor, the method comprising the steps of:
   a. providing a thermal insert for the rapid thermal processing reactor, the thermal insert composed of thermal conductive material, the thermal insert having a convex shape; and,
   b. placing the thermal insert in close proximity to, but spaced apart from, the wafer to cause differential heat transfer between the wafer and the thermal insert based upon spacing differences between the thermal insert and the wafer, thereby improving center-to-edge temperature uniformity during heating in the rapid thermal processing reactor; and,
   c. wherein the thermal insert has locator holes to align with the wafer support pins and the thermal insert is supported by the bottom plate.

2. The method of claim 1, wherein the wafer has a center and an edge and the thermal insert has a radius of curvature and further wherein the thermal insert and the wafer are in concentric alignment such that the center of the wafer is closest to the thermal insert and the edge is spaced further from the thermal insert than the center.

3. The method of claim 1, wherein the thermal insert is composed of aluminum.

4. The method of claim 1, wherein the thermal insert is composed of stainless steel.

5. The method of claim 1, wherein the thermal insert is thicker at its center than its edge.

6. The method of claim 1, wherein the thermal insert has a flat base.

7. The method of claim 1, wherein the rapid thermal processing reactor has a bottom plate and the thermal insert is supported by the bottom plate.

8. The method of claim 1, wherein the rapid thermal processing reactor has a bottom plate and support pins extending upward from the bottom plate to support the wafer in the rapid thermal processing reactor.

9. The method of claim 1, wherein the support pins are vertically oriented.

10. The method of claim 1, wherein the wafer is supported in a concentrically aligned and spaced apart relationship above the thermal insert by support pins protruding vertically from the thermal insert.

11. A method for uniform direct radiant heating in a rapid thermal processing reactor, the method comprising the steps of:
   a. providing a rapid thermal reactor including:
      (1) a process chamber, the process chamber enclosing a volume;
      (2) a heat radiation source, the heat radiation source being located external to the process chamber;
      (3) a transparent window on the chamber, the transparent window allowing passage of heat radiation from the heat radiation source into the process chamber;
      (4) an object disposed within the chamber, the object being generally flattened and having a center and an edge;
   b. providing a geometrically configured thermal insert of heat conductive material, the thermal insert including a low profile dome-like top, the thermal insert being situated within the process chamber underlying the object with a portion of the dome-like top in close proximity to the center of the object and the object progressively spaced further away from the dome-like top at locations closer to the edge of the object, such that the thermal insert exchanges heat with the object at different rates depending upon the distance between the center of the object and the edge of the object, the exchange rate being highest at the center and lowest at the edge, so as to facilitate uniform temperature in the object during heating;
   c. wherein the object is supported in a spaced apart relationship to the thermal insert by vertical support pins; and,
   f. wherein the vertical support pins arise from a base plate and protrude through locator holes in the thermal insert and wherein the thermal insert is supported by the base plate.

* * * * *